United States Patent

Yoshimoto et al.

[11] Patent Number: 5,856,720
[45] Date of Patent: Jan. 5, 1999

[54] SURFACE ACOUSTIC WAVE DEVICE

[75] Inventors: Susumu Yoshimoto; Yasushi Yamamoto, both of Tokyo, Japan

[73] Assignee: NEC Corporation, Tokyo, Japan

[21] Appl. No.: 813,100

[22] Filed: Mar. 7, 1997

[30] Foreign Application Priority Data

Mar. 19, 1996 [JP] Japan .................................. 8-062468

[51] Int. Cl.$^6$ .................................................. H01L 41/08
[52] U.S. Cl. .................................. 310/313 R; 310/313 B; 310/313 D
[58] Field of Search .......................... 310/313 D, 313 R, 310/313 B, 361; 333/193, 195

[56] References Cited

FOREIGN PATENT DOCUMENTS 62-219709  9/1987  Japan .

Primary Examiner—Clayton LaBalle
Assistant Examiner—Timothy A. Williams
Attorney, Agent, or Firm—Scully, Scott, Murphy & Presser

[57] ABSTRACT

In a resonator type surface acoustic wave filter, a fundamental mode of a mode to distribute in a direction perpendicular to propagating direction of a surface acoustic wave (hereinafter referred to as transverse mode) becomes a primary response, whereas a transverse secondary mode becomes spurious. In case of the surface acoustic wave device formed on a piezoelectric substrate having smaller electromechanical coupling factor of a quartz substrate or so forth, it is impossible to obtain sufficient restriction of the second mode spurious. This problem is solved by canceling electrical potential of transverse secondary mode and whereby restricting excitation with a resonator type surface acoustic device formed on a quartz substrate, in which a configuration of an interdigital electrode is selected to establish a ratio of an overlap width of an electrode finger versus an aperture width in a range greater than or equal to 0.75 to smaller than or equal to 0.85.

16 Claims, 5 Drawing Sheets

SURFACE ACOUSTIC WAVE DEVICE

BACKGROUND OF THE INVENTION

1. Field of the Invention

The present invention relates generally to a surface acoustic wave device. More specifically, the invention relates to a resonator type surface acoustic wave device utilizing a longitudinal mode and operative in a frequency range of a VHF band and a UHF band.

2. Description of the Related Art

In a resonator type surface acoustic wave device, fundamental mode of a mode where energy is distributed perpendicularly to propagating direction of a surface acoustic wave (hereinafter referred to as transverse mode), is a primary propagation mode. In certain case, a transverse secondary mode becomes spurious.

For restricting the transverse secondary mode to be spurious, there is a technology to narrow an aperture with W0 of an interdigital electrodes 91 and 92 and grating reflectors 4 and 5 for cutting off the transverse higher mode spurious, as shown in FIG. 8. It should be noted that the reference numeral 10 denotes a piezoelectric substrate.

Another technology is to provide weighting of $COS^{-1}$ function for electrode length of the interdigital electrode 81, as shown in FIG. 9.

A further technology has been disclosed in Japanese Unexamined Patent Publication (Kokai) No. Showa 62-219709, in which is proposed a method to set a ratio W/W0 of a overlap width W versus the aperture width W0 of the interdigital electrode in a range of 0.65 to 0.75.

In the technologies simply minimizing the aperture width W0 as shown in FIG. 8 and providing $COS^{-1}$ function weighting as shown in FIG. 9, a configuration of the interdigital electrode is restricted to make it difficult to obtain desired characteristics of the surface acoustic wave device and thus to restrict design thereof.

Even when the technology disclosed in Japanese Unexamined Patent Publication No. Showa 62-219709 is employed, little restriction effect for the transverse secondary spurious mode can be obtained in the surface acoustic wave device on a piezoelectric substrate having small electromechanical coupling factor, such as a quartz substrate or so forth.

The reason is as follows. In the substrate having small electromechanical coupling coefficient, a difference between a velocity of the surface acoustic wave propagating in the interdigital electrode and a velocity of the surface acoustic wave propagating a portion other than inside of the interdigital electrode becomes small to weaken cooping of transverse mode energy within the interdigital electrode.

At this time, distribution of the transverse mode spreads transversely perpendicular to the propagating direction of the surface acoustic wave. Then, simultaneously with shifting of a peak position of distribution of the transverse secondary mode (see 22 of FIG. 2) out of the interdigital electrode, the aperture width for canceling transverse secondary mode excitation becomes large.

SUMMARY OF THE INVENTION

It is an object of the present invention to provide a resonator type surface acoustic wave device which can satisfactorily restrict a transverse secondary mode and achieves high freedom of design.

According to one aspect of the invention, a surface acoustic wave device comprises:

a piezoelectric substrate; and interdigital electrode formed on one primary surface of the piezoelectric substrate, the interdigital electrode having a ratio of an overlap width versus an aperture width set in a range greater than 0.75 and smaller than or equal to 0.85.

According to another aspect of the invention, a surface acoustic wave device comprises:

a piezoelectric substrate employing a quartz substrate;

interdigital electrodes formed on one primary surface of the piezoelectric substrate, the interdigital electrode having a ratio of an overlap width versus an aperture width being set at 0.75.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

For facilitating clear understanding of the invention, an operation of the present invention will be briefly discussed. A problem to be encountered in a transverse mode spurious of a resonator type surface acoustic wave device is a distribution of a transverse secondary mode relative to a transverse fundamental mode as a primary resonance mode. A distribution of the fundamental mode all falls within a positive region as shown by 21 in FIG. 2, whereas the distribution of the transverse secondary mode being spurious falls within both of positive and negative region. Accordingly, by selecting an overlap width of element of the interdigital electrode so that the areas in the positive and negative regions of the transverse secondary mode distribution become equal to each other, the energy for generating the secondary mode can be substantially canceled. As a result, the transverse secondary mode surface acoustic wave may not be excited or received by the interdigital electrode.

The preferred embodiments of the surface acoustic device according to the present invention will be discussed with reference to the drawings, particularly to FIGS. 1 to 7.

Figure 1:
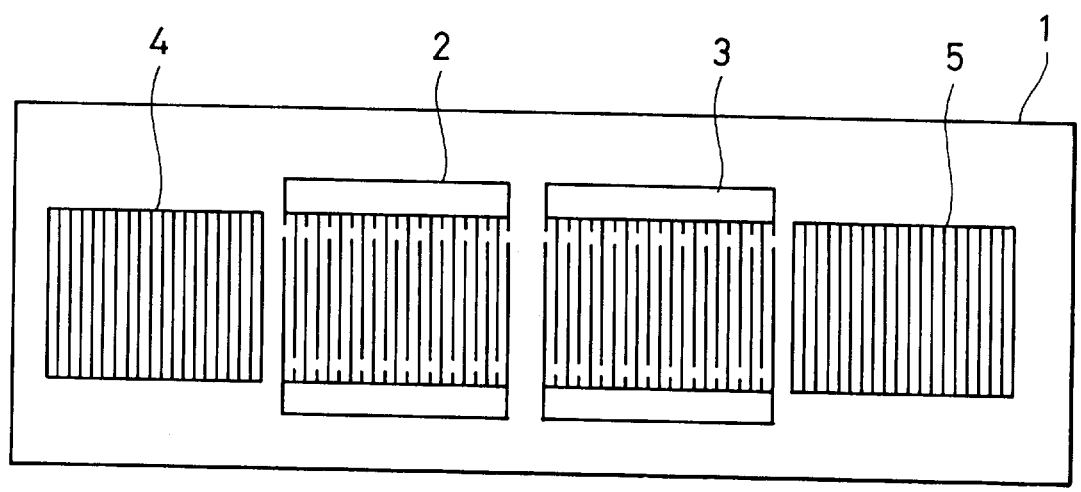
FIG. 1 is a plan view of one embodiment of a surface acoustic wave device according to the present invention.

FIG. 1 is a plan view of the preferred embodiment of a resonator type surface acoustic wave filter according to the present invention. In FIG. 1, a quartz substrate is employed as a piezoelectric substrate 1. On one primary surface of the quartz substrate 1, interdigital electrodes 2 and 3 respectively formed of a metal thin film are provided for mutually opposing respective the electrode portion.

On the outsides of these interdigital electrodes 2 and 3 (namely left side of the interdigital electrode 2 and right side of the interdigital electrode 3), grating reflectors 4 and 5 similarly formed of metal thin film are formed.

When an alternating current voltage is applied to the interdigital electrodes 2 and 3, due to piezoelectric effect, a surface acoustic wave to be propagated in a direction perpendicular to the electrode finger (left and right direction in FIG. 1) is excited on the surface of the quartz substrate 1.

Conversely, when the surface acoustic wave incides on the interdigital electrodes 2 and 3, a voltage proportional to amplitude of the incident surface acoustic wave is generated in the interdigital electrode.

The grating reflectors 4 and 5 provided outside of these interdigital electrodes 2 and 3 serve for reflecting the surface acoustic wave toward inside so that the excited surface acoustic wave may not leak outside to enclose the energy of the surface acoustic wave.

Then, the feature of the present invention is, different from Japanese Unexamined Patent publication No. Showa 62-219709, a ratio (W/W0) of a overlap width W versus an anaperture width W0 is set in a range of 0.75~0.85 (not including 0.75).

Figure 2:
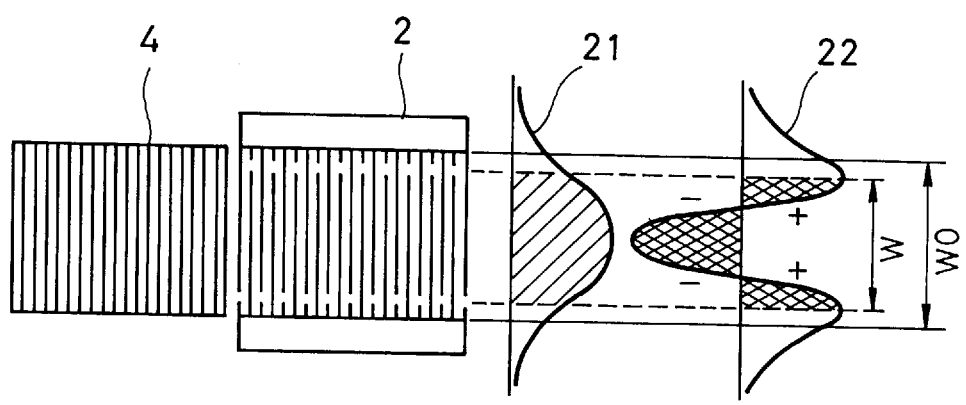
FIG. 2 is an illustration for explaining transverse modes generated in the embodiment of FIG. 1.

Next, operation will be discussed with reference to FIG. 2. It should be noted that, in FIG. 2, the hatched portion and cross-hatched portion in transverse mode distributions 21 and 22 represent exciting regions. Here, while both of the positive region and negative region are present in a transverse secondary mode distribution 22, when the overlap width W of the electrode is made smaller than the aperture width W0 so that the areas of both regions, i.e. the positive region and the negative region, are equal to each other, the electrical charge in the positive (+) region and the negative (−) region cancels to each other, excitation in the transverse secondary mode can be restricted.

On the other hand, excitation efficiency of the transverse fundamental mode 21 as primary propagation mode is determined by the hatched area. The lowering of the excitation efficiency of the fandamental mode due to reduction of the overlap width is merely several percent and thus will not create significant problem.

Figure 3:
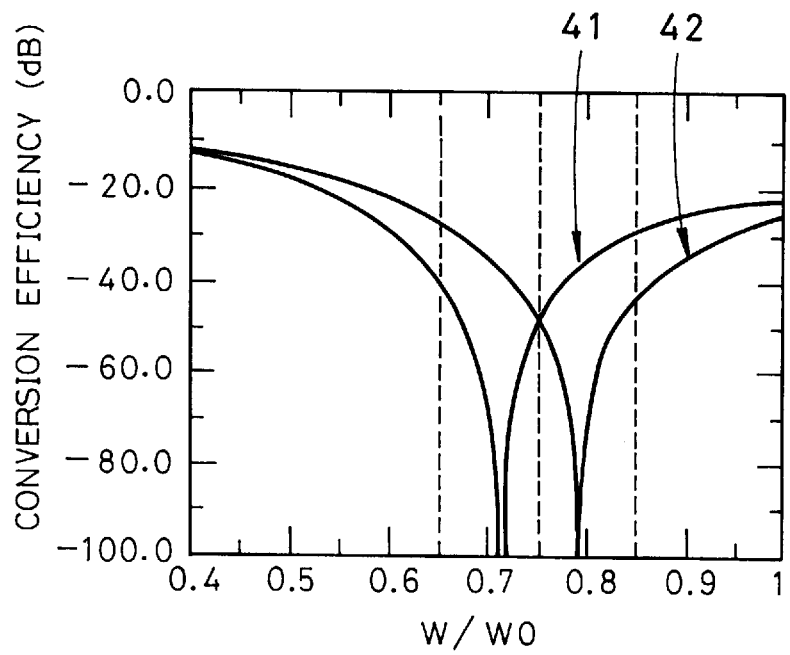
FIG. 3 is an illustration showing a theoretically calculated value of an excitation efficiency of a transverse secondary spurious mode for explaining the effect of the present invention.

FIG. 3 shows a result of theoretical calculation of W/W0 dependency of the transverse secondary mode excitation efficiency. As an example, a calculation example corresponding to the example of Japanese Unexamined Patent Publication No. Showa 62-219709 is shown by a curve 41, and a calculation example in the application of the present invention is shown by a curve 42.

In FIG. 3, a small value of conversion efficiency represents that a transverse secondary spurious mode is restricted. The curve 42 is a calculation value in the case where a ST cut quartz panel is used as substrate 1, a ratio H/$\lambda$ of a layer thickness H of an electrode finger of the interdigital electrode versus a surface acoustic wave length $\lambda$ is set 0.03, and aperture width W0 of the electrode finger of the interdigital electrode is set 20 $\lambda$.

In the curve 42, at W/W0=0.8, the excitation efficiency of the transverse secondary mode is restricted to be 80 dB. In contrast to this, at W/W0=0.65, secondary mode is ristricted to be 30 dB only.

In view of the fact set forth above, when the surface acoustic wave device is formed on the piezoelectric substrate having large electromechanical coupling factor, such as lithium niobate ($LiNbO_3$) substrate, lithium tantalate ($LiTaO_3$) and so forth, when the method shown in Japanese Unexamined Patent Publication No. Showa 62-219709 is applied, sufficient restriction of the transverse secondary spurious mode becomes possible. However, in case of the surface acoustic wave device formed on the substrate having small electromechanical coupling factor, such as quartz, it has been found that there are some possibility that sufficient restriction effect of the transverse secondary mode spurious becomes impossible in W/W0 ranging between 0.65 to 0.75.

Here, it is desirable to limit the W/W0 at 0.85 as upper limit in the practical view point. That is, in practicing the resonator type surface acoustic wave device on the quartz substrate, 200 or more of metal grating reflectors and 0.5 or higher reflection index are required at the minimum, and sufficient restriction of the transverse secondary spurions mode cannot be realized in a range where W/W0 becomes greater than 0.85.

In view of this fact, in the surface acoustic wave device formed on the substrate having small electromechanical coupling factor, such as ST cut quartz substrate or so forth, an appropriate range of W/W0 is 0.75 to 0.85. Here, the lower limit value, i.e. 0.75 is included in the preferred range of Japanese Unexamined Patent Publication No. Showa 62-219707. However, in the above-identified publication, application for the substrate having small electromechanical coupling coefficient, such as quartz substrate, has not been considered at all. Therefore, in case that the quartz substrate is employed, W/W0=0.75 should be included in the range proposed by the present invention.

Figure 4:
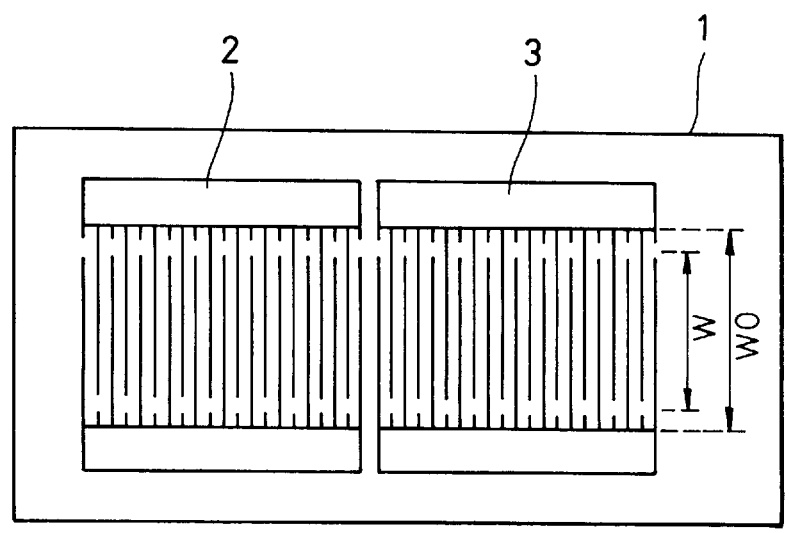
FIG. 4 is a plan view for explaining one concrete embodiment of the present invention.
Figure 5:
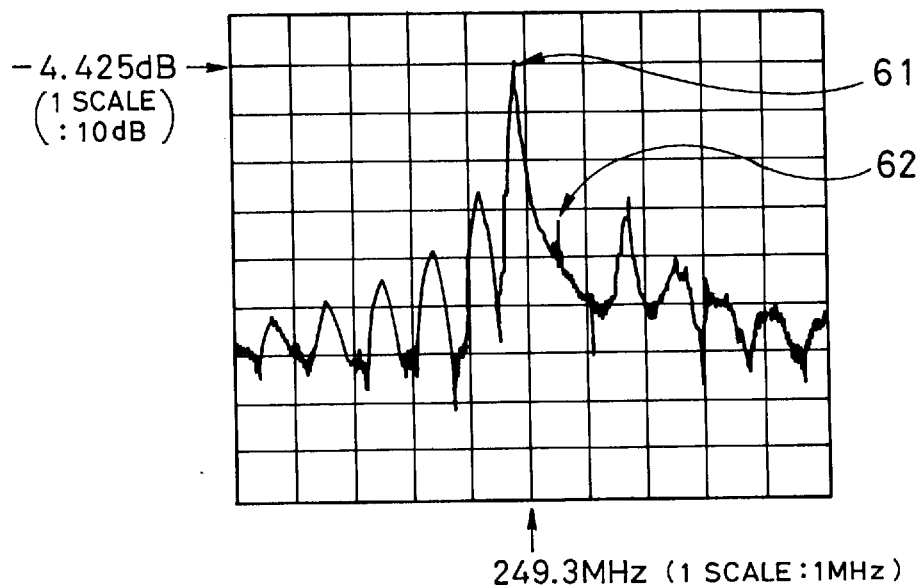
FIG. 5 is an illustration showing a frequency-amplitude characteristics of a filter in the embodiment of the present invention.

FIG. 4 is a plan view of concrete embodiment of the surface acoustic device according to the present invention, which shows the case where a longitudinal mode resonator type surface acoustic wave filter is formed on one primary surface of the ST cut quartz substrate 1, and FIG. 5 is an illustration showing a frequency-amplitude characteristics of the longitudinal mode resonator type surface acoustic wave filter of FIG. 4.

A center frequency is set at 249.3 MHz. As material for forming the interdigital electrodes 2 and 3, aluminum is used (layer thickness is 0.32 $\mu$m). The aperture width W0 of the interdigital electrodes 2 and 3 is set at 20 $\lambda$, and the overlap width W of interdigital electrode is set at 16 $\lambda$/. Also, number of pairs of the input/output interdigital electrodes 2 and 3 are both 250.

Accordingly, W/W0 versus aperture width of the overlap width of the electrode finger of the interdigital electrodes 2 and 3 of the embodiment shown in FIG. 4 becomes 0.8. For comparison, the frequency-amplitude characteristics of the surface acoustic wave filter set the overlap width W of the electrode finger of the interdigital electrode at 19.75 λ (W/W0=0.99) is also shown in FIG. 6.

Figure 6:
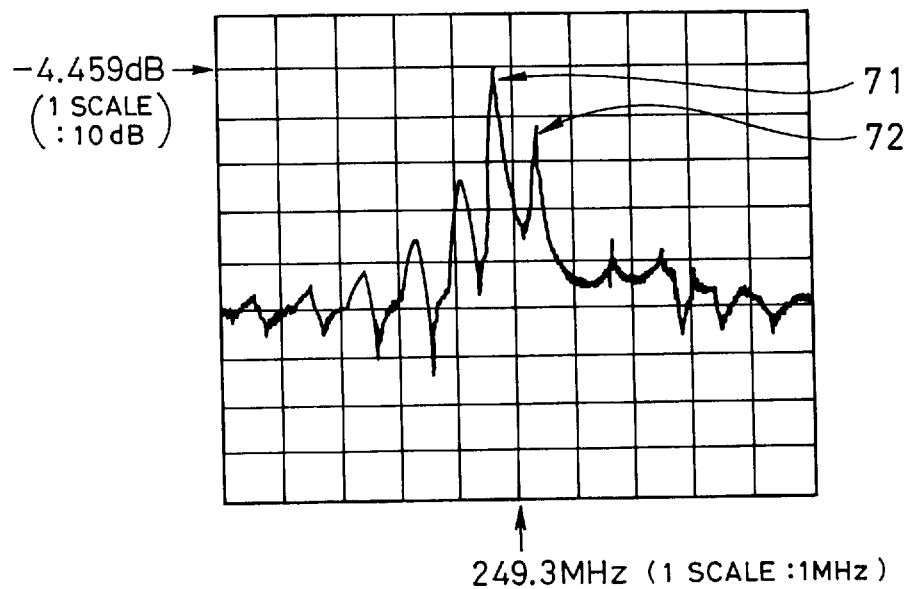
FIG. 6 is an illustration showing a frequency-amplitude characteristics of a filter in the conventional method.

In FIG. 6, the transverse secondary mode spurious 72 appears significantly in the vicinity of high range of primary resonance 71. In contrast to this, in the amplitude characteristics shown in FIG. 5, in which the present invention is applied, the transverse secondary spurious mode 62 appearing in the vicinity of high range of the primary resonance 61 can be restricted to be higher than or equal to 35 dB. Thus, the effect of the present invention can be confirmed.

Figure 7:
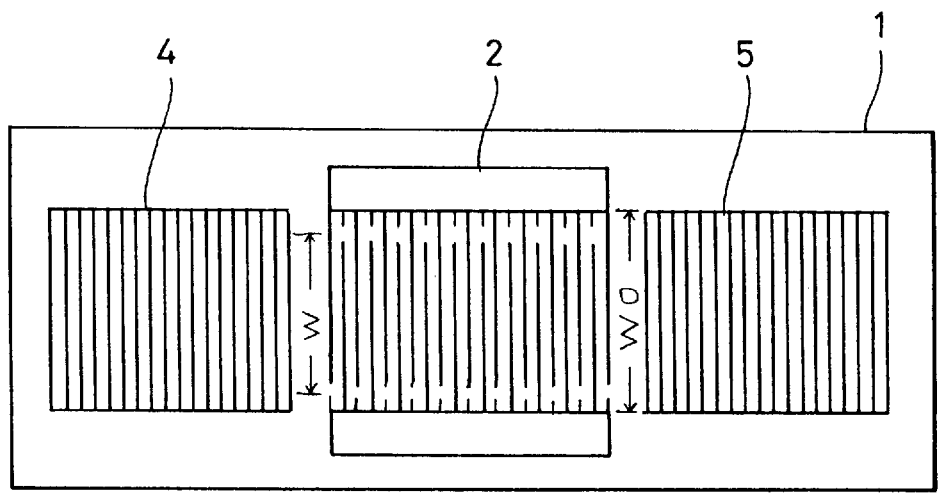
FIG. 7 is a plan view of another embodiment of a surface acoustic wave device according to the invention.
Figure 8:
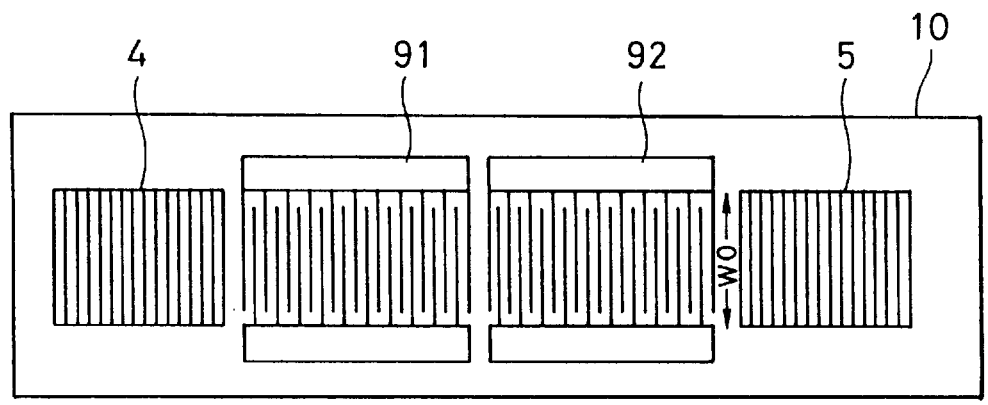
FIG. 8 is a plan view showing one example of the conventional surface acoustic wave device.
Figure 9:
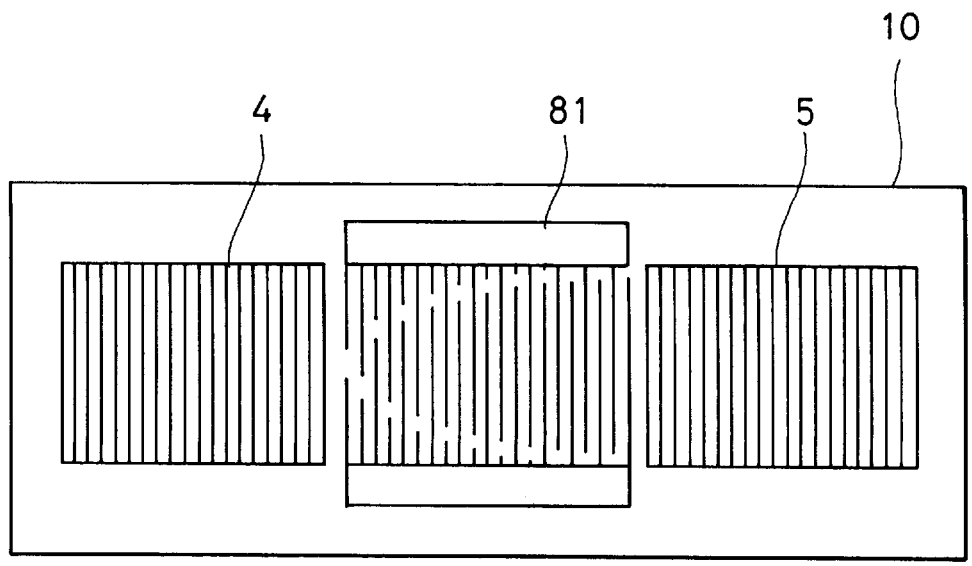
FIG. 9 is a plan view showing another example of the conventional surface acoustic wave device.

FIG. 7 is a plan view of another embodiment of the surface acoustic wave device according to the present invention, which is shown in the case of single port type surface acoustic wave resonator. The interdigital electrode is only one set (shown by reference numeral 2). The grating reflectors 4 and 5 are provided at both sides of the interdigital electrode. Even in this case, W/W0 of the interdigital electrode 2 is selected within the range set forth above. Thus, spurious restriction effect of the transverse secondary mode can be obtained.

As set forth above, according to the present invention, the ratio of the aperture width and the overlap width is only limited. Thus, freedom in designing becomes large in comparison with the spurious restriction method by conventional $COS^{-1}$ function weighting of the interdigital electrode and method making the aperture width smaller.

On the other hand, even with respect to the surface acoustic wave device employing the piezoelectric substrate which has small electromechanical coupling factor, such as quartz substrate, sufficient restriction of the transverse secondary spurious mode becomes possible.

What is claimed is:

1. A surface acoustic wave device for generating and receiving acoustic waves having fundamental and transverse secondary modes, the wave device comprising:
   a piezoelectric substrate; and
   interdigital electrode formed on one primary surface of said piezoelectric substrate, said interdigital electrode having a ratio of a overlap width versus an aperture width set in a range greater than 0.75 and smaller than or equal to 0.85 so that areas in positive and negative regions of the transverse secondary mode are substantially equal to each other, whereby the transverse secondary mode of the surface acoustic wave is not excited and is not received by the interdigital electrode.

2. A surface acoustic wave device as set forth in claim 1, wherein said piezoelectric substrate is formed of a material having small electromechanical coupling factor smaller than lithium niobate and lithium tantalate.

3. A surface acoustic wave device as set forth in claim 2, wherein said piezoelectric substrate is a quartz substrate.

4. A surface acoustic wave device as set forth in claim 1, wherein two interdigital electrodes are provided in propagating direction of said surface acoustic wave.

5. A surface acoustic wave device as set forth in claim 1, wherein said interdigital electrode is provided in a single port type surface acoustic wave resonator.

6. A surface acoustic wave device as set forth in claim 1, wherein said overlap width is set constant within said interdigital electrode.

7. A surface acoustic wave device as set forth in claim 1, wherein a ratio H/λ of a layer thickness H of an electrode finger of said interdigital electrode versus a wavelength λ of the surface acoustic wave is set at 0.03, and the aperture width W0 of said interdigital electrode is set at 20 λ.

8. A surface acoustic wave device as set forth in claim 1, wherein said interdigital electrode is an aluminum.

9. A surface acoustic wave device as set forth in claim 1, which further comprises grating reflector provided at both sides of said interdigital electrode.

10. A surface acoustic wave device for generating and receiving acoustic waves having fundamental and transverse secondary modes, the acoustic wave device comprising:
    a piezoelectric substrate employing a quartz substrate;
    interdigital electrodes formed on one primary surface of said piezoelectric substrate, said interdigital electrode having a ratio of a cross width versus an opening length being set at 0.75 so that areas in positive and negative regions of the transverse secondary mode are substantially equal to each other, whereby the transverse secondary mode of the surface acoustic wave is not excited and is not received by the interdigital electrode.

11. A surface acoustic wave device as set forth in claim 10, wherein two interdigital electrodes are provided in propagating direction of said surface acoustic wave.

12. A surface acoustic wave device as set forth in claim 10, wherein said interdigital electrode is provided in a single port type surface acoustic wave resonator.

13. A surface acoustic wave device as set forth in claim 10, wherein said overlap width is set constant within said interdigital electrode.

14. A surface acoustic wave device as set forth in claim 10, wherein a ratio H/λ of a layer thickness H of an electrode finger of said interdigital electrode versus a wavelength λ of the surface acoustic wave is set at 0.03, and the aperture width W0 of said interdigital electrode is set at 20 λ.

15. A surface acoustic wave device as set forth in claim 10, wherein said interdigital electrode is an aluminum.

16. A surface acoustic wave device as set forth in claim 10, which further comprises grating reflector provided at both sides of said interdigital electrode.

* * * * *